US006563704B2

(12) United States Patent
Grouell et al.

(10) Patent No.: US 6,563,704 B2
(45) Date of Patent: May 13, 2003

(54) STORAGE DEVICE ARRANGEMENT FOR INCREASED COOLING

(75) Inventors: William L. Grouell, San Ramon, CA (US); Fay Chong, Jr., Cupertino, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 14 days.

(21) Appl. No.: 09/882,421

(22) Filed: Jun. 15, 2001

(65) Prior Publication Data

US 2003/0002251 A1 Jan. 2, 2003

(51) Int. Cl.[7] .............................................. G06F 1/16
(52) U.S. Cl. .................. 361/687; 361/684; 361/685
(58) Field of Search ................. 361/683–724; 454/184; 165/80.3; 312/236, 223.2

(56) References Cited

U.S. PATENT DOCUMENTS

| | | | | |
|---|---|---|---|---|
| 5,208,722 A | * | 5/1993 | Ryan et al. | 360/99.01 |
| 5,398,159 A | * | 3/1995 | Andersson et al. | 361/695 |
| 5,506,750 A | * | 4/1996 | Carteau et al. | 361/685 |
| 5,772,500 A | * | 6/1998 | Harvey et al. | 454/184 |
| 5,781,408 A | * | 7/1998 | Crane et al. | 361/683 |
| 5,796,580 A | | 8/1998 | Komatsu et al. | |
| 5,822,184 A | * | 10/1998 | Rabinovitz | 361/685 |
| 6,144,553 A | | 11/2000 | Hileman et al. | |

FOREIGN PATENT DOCUMENTS

JP  2000149541  * 5/2000  ........... G11B/33/14

* cited by examiner

*Primary Examiner*—Darren Schuberg
*Assistant Examiner*—Anthony Q. Edwards
(74) *Attorney, Agent, or Firm*—Robert C. Kowert; Meyertons, Hood, Kivlin, Kowert & Goetzel, P.C.

(57) ABSTRACT

Various methods and systems for cooling high-density arrangements of disk drives are disclosed. A disk drive enclosure includes several stacked layers of disk drives and one or more air movers. Some of the air movers are configured to cool the disk drives by creating an airflow. The disk drives are configured to operate as a network or computer storage system. Instead of being arranged in a traditional, aligned arrangement, the disk drives are arranged in an offset or staggered arrangement so that at least one disk drive in a first layer is offset from an overlapping disk drive in a second layer. The offset is in a direction parallel to the plane that includes the first layer. As a result, at least part of one of the disk drives in the arrangement is exposed to more of the airflow than it would be exposed to in an aligned arrangement.

39 Claims, 8 Drawing Sheets

Fig. 1

(Prior Art)

STORAGE DEVICE ARRANGEMENT FOR INCREASED COOLING

BACKGROUND OF THE INVENTION

1. Field of the Invention

This invention relates to disk drives and, more particularly, to high-density arrangements of disk drives in enclosures and the cooling of such arrangements.

2. Description of the Related Art

Electronic devices such as disk drives are designed to operate within certain temperature ranges. However, when operating, devices such as disk drives may generate heat. If enough heat is generated to cause one of the disk drives to operate outside of its operational temperature range, problems may occur. For example, in some cases, increased temperature may cause a device to malfunction or behave erroneously. Sometimes, increased heat may even damage the electronic devices.

Historically, individual disk drives have not been particularly troublesome heat generating components. Most disk drives were adequately cooled using passive cooling techniques and/or by relying on a system fan, and thus overheating problems rarely occurred. As disk drives have become faster, however, their heat generation has increased. For example, as access speeds have increased, the spindle motors have become faster and more powerful. As a result, the spindle motors have also begun generating more heat. Thus, the cooling of individual disk drives is becoming much more of a concern than it has been in the past.

Another related cooling concern arises when multiple disk drives are placed close together within an enclosure. With rising data storage needs and decreasing storage media costs, more storage media such as disk drives may be included in enclosures. For example, a group of disk drives may be set up as a RAID (Redundant Array of Inexpensive/Independent Disks) system. Alternately, a group of disks may be arranged in a JBOD (Just a Bunch Of Disks) configuration, which is any group of disks that are not set up in any specific RAID configuration. A common engineering goal is to achieve high-density packaging of disk drives in an enclosure so that the overall storage system takes up a minimal amount of space. However, this goal is often hindered by the need to cool the disk drives. In many cases, the probability of heat-related problems increases as disk drives are packaged more closely together. For example, a disk drive's ability to transfer heat away from itself may be reduced as the airflow over that disk drive is reduced. When multiple disk drives are packaged closely together, the airflow over some of the disk drives may be blocked by the surrounding disk drives. Additionally, the combined heat generation from all of the disk drives may create a much hotter area than each disk drive would create individually. Thus, the disk drives in a high-density arrangement are likely to be in a hotter environment due to the heat generation of neighboring drives. Furthermore, the disk drives may not be able to transfer as much heat away because the neighboring drives may be blocking their airflow. As a result of these types of factors, disk drives in a high-density arrangement may be likely to develop heat-related problems.

Figure 1:
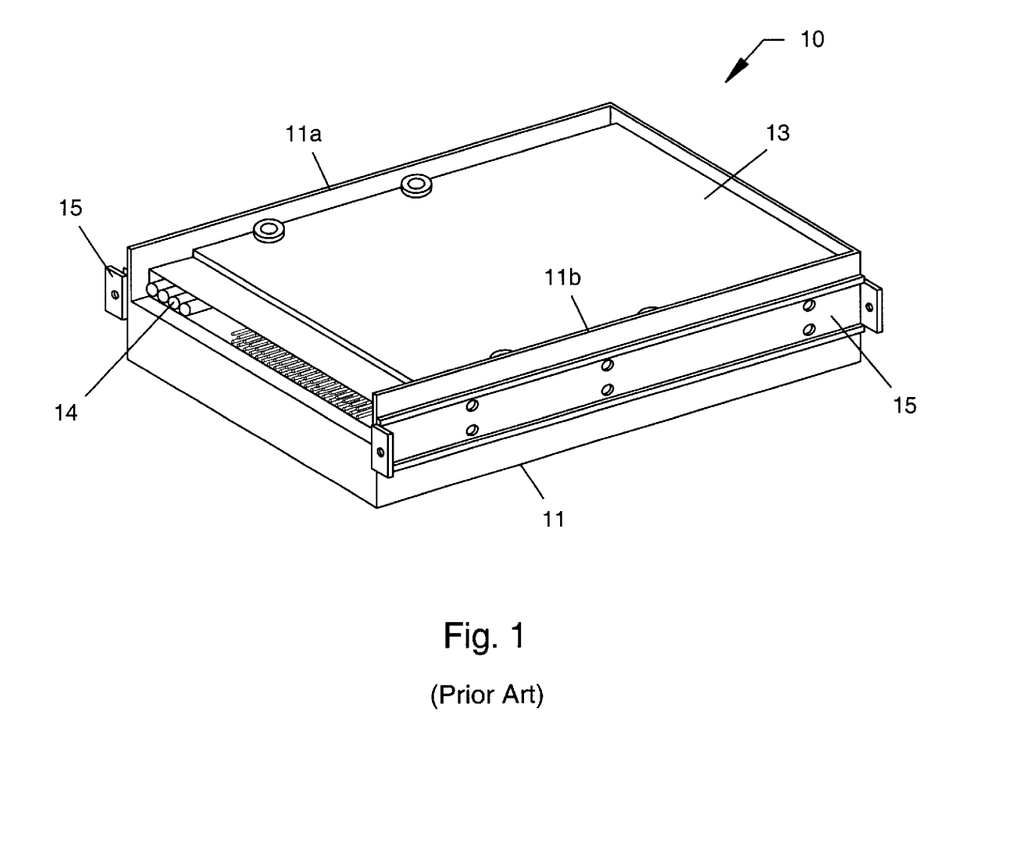
FIG. 1 is an illustration of a typical disk drive with bathtub-like sides blocking airflow to the drive's printed circuit board.

The likelihood of heat-related problems may be exacerbated by the construction of the disk drives themselves. For example, some disk drives are designed so that the sides of the drive chassis extend to create a bathtub-like enclosure around the printed circuit board. An example of this is shown in FIG. 1. The drive chassis 11 encloses the head disk assembly, which includes the disk platter, spindle, spindle motor, actuators, etc (not shown). The connectors 14 are used to connect a disk drive to other devices and facilitate the transfer of data to and from the disk drive 10. The rails 15 may be used to mount the disk drive within an enclosure. The printed circuit board 13, also referred to as a logic board, contains most of the logic that controls operation of and communication with the disk drive 10. The sides 11a and 11b of the drive chassis may impede airflow over the logic board 13 and thus limit the logic board's ability to transfer heat away from itself. If such a disk drive is used in a system where many disk drives are tightly packaged together, the airflow and ability to transfer heat may be additionally reduced over the printed circuit board due to the "bath tub" sides and the chances of heat-related problems may be increased.

In some existing systems designed to provide adequate cooling for high-density arrangements of drives, elaborate cooling systems have been used. For example, in one existing system, a refrigeration system is connected to a disk drive storage using a pair of thin metal plates that sandwich a disk drive. The plates conduct heat away from the disk drive and are cooled by the refrigeration system to improve their heat-removing capability. In other systems, fans and heat sinks are added to disk drives to improve their cooling. While these systems may adequately cool the disk drives, they add an undesirable degree of complexity and may undesirably increase the overall size of the storage system.

SUMMARY

Various embodiments of methods and systems for cooling high-density arrangements of disk drives are disclosed. In one embodiment, a storage system may include several stacked layers of disk drives and one or more air movers. At least some of the air movers may be configured to cool the disk drives by creating an airflow. The disk drives may be configured to operate as a network or computer storage system. Instead of being arranged in a traditional, aligned arrangement, the disk drives may be arranged in an offset or staggered arrangement. Thus, at least one disk drive in a first layer may be offset from an overlapping disk drive in a second layer. This offset is in a direction parallel to the plane that includes the first layer. As a result of this offset, at least part of one of the disk drives in the arrangement is exposed to more of the airflow than it would be exposed to in an aligned arrangement.

In some embodiments, every disk drive in the first layer may be offset from a corresponding overlapping disk drive in the second layer. In one embodiment, the entire first layer may be offset from the entire second layer. In one embodiment, the offset used may be a lateral offset. In another embodiment, the offset may be a longitudinal offset. In still another embodiment, both a lateral and a longitudinal offset may be used. In addition to being offset, the disk drives in one embodiment may be inclined so that they are not parallel to the airflow.

In one embodiment, the offset may create an air gap between overlapping disk drives. This air gap may be configured to divert a portion of the airflow, and as a result, at least part of one of the disk drives may be exposed to more of the airflow than it would be exposed to in a traditional, aligned arrangement. The air gap may, in one embodiment, divert the airflow so that the logic board of a disk drive is exposed to more of the airflow than it otherwise would be. In one embodiment, the air gap may divert the airflow so that the surface area of the disk drive is exposed to more of the airflow than it would be in an aligned arrangement.

The amount of the offset may be greater than the width of one of the "bath tub" sides of one of the disk drives in some embodiments. This amount of offset may expose the logic board of a disk drive to more of the airflow than it would be exposed to in an aligned arrangement. In one embodiment, a continuous air channel may separate stacks of the disk drives. The offset arrangement may, in one embodiment, not greatly increase the space consumed by the disk drives. As a result, in one embodiment, the enclosure housing the offset arrangement of disk drives may be the same size as it would be if the disk drives had an aligned arrangement. Furthermore, in one embodiment, the offset arrangement may not substantially affect the accessibility of the drives for connection, repair, hot swapping, or replacement. Thus, the physical accessibility of the offset arrangement of disk drives may be substantially the same as it would be if the disk drives had an aligned arrangement.

In another embodiment, a storage system may include several stacked layers of disk drives and one or more air movers. The disk drives may be configured to operate as a computer or network storage system. Each layer may include one or more disk drives. At least one of the stacked layers may be inclined so that it is not parallel to the primary direction of the airflow created by the air movers. As a result of this inclination, at least part of one of the disk drives is exposed to more of the airflow than it would be in a traditional, non-inclined arrangement. Furthermore, in one embodiment, all of the stacked layers may be inclined so that none of the layers are parallel to the airflow. In some embodiments, some of the disk drives may also be offset from each other in addition to being inclined.

In one embodiment, the degree of inclination may be such that a logic board or a surface area of the one of the disk drives is exposed to more of the airflow than it would be exposed to in a non-inclined arrangement.

The inclined arrangement may not greatly increase the space consumed by the disk drives in some embodiments. Thus, in those embodiments, the size of the disk drive enclosure housing the inclined arrangement of disk drives may be the same as it would be if the disk drives had a traditional, aligned arrangement. Similarly, in some embodiments, the inclined arrangement may not have a substantial effect on the accessibility of the disk drives for connection, repair, hot swapping, or replacement. Thus, in those embodiments, the inclined arrangement may have substantially the same physical accessibility as would be had in an aligned arrangement.

In another embodiment, a method for packaging a plurality of disk drives within an enclosure for use as a computer or network storage system is disclosed. The method includes installing one or more air movers in the enclosure and mounting several layers of disk drives within the enclosure. The air movers are installed within the enclosure so that, when operating, a first portion of the air movers cools the disk drives by generating an airflow. The disk drives are mounted so that at least one disk drive in a first layer is offset from an overlapping disk drive in a second layer. As a result of this mounting technique, at least a part of one of the disk drives is exposed to more of the airflow than it would be if the disk drives had been mounted in an aligned arrangement.

In one embodiment, mounting the disk drives may involve mounting them so that at least one layer of disk drives is not parallel to a primary direction of the airflow. In some embodiments, mounting the disk drives may involve mounting them so that every disk drive in a first layer is offset from a corresponding, overlapping disk drive in a second layer. The offset may be a lateral offset, a longitudinal offset, or both.

In another embodiment, a method of cooling a plurality of disk drives within an enclosure is disclosed. The method includes performing memory transfers to or from the disk drives, one or more of the disk drives generating heat, and generating an airflow over offset or inclined regions of the disk drives within the enclosure in order to cool the disk drives. The disk drives are arranged so that one or more layers of the disk drives are offset from each other or so that one or more layers of the disk drives are inclined against the primary direction of the airflow. As a result of this arrangement, at least part of one of the disk drives is exposed to more of the airflow than it would be exposed to if the layers were arranged in a traditional, aligned, and/or non-inclined arrangement.

In another embodiment, a storage system may include several stacked layers of disk drives and one or more air movers. Each layer may include one or more disk drives. The disk drives may be configured to operate as a computer or network storage system. The disk drives and the air movers may be mounted within an enclosure. At least one of the stacked layers may be inclined so that it is not parallel to the floor of the enclosure. As a result of this inclination, at least part of one of the disk drives is exposed to more of the airflow than it would be in a traditional, non-inclined arrangement. Furthermore, in one embodiment, all of the stacked layers may be inclined so that none of the layers are parallel to the floor of the enclosure. In some embodiments, some of the disk drives may also be offset from each other in addition to being inclined.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 2:
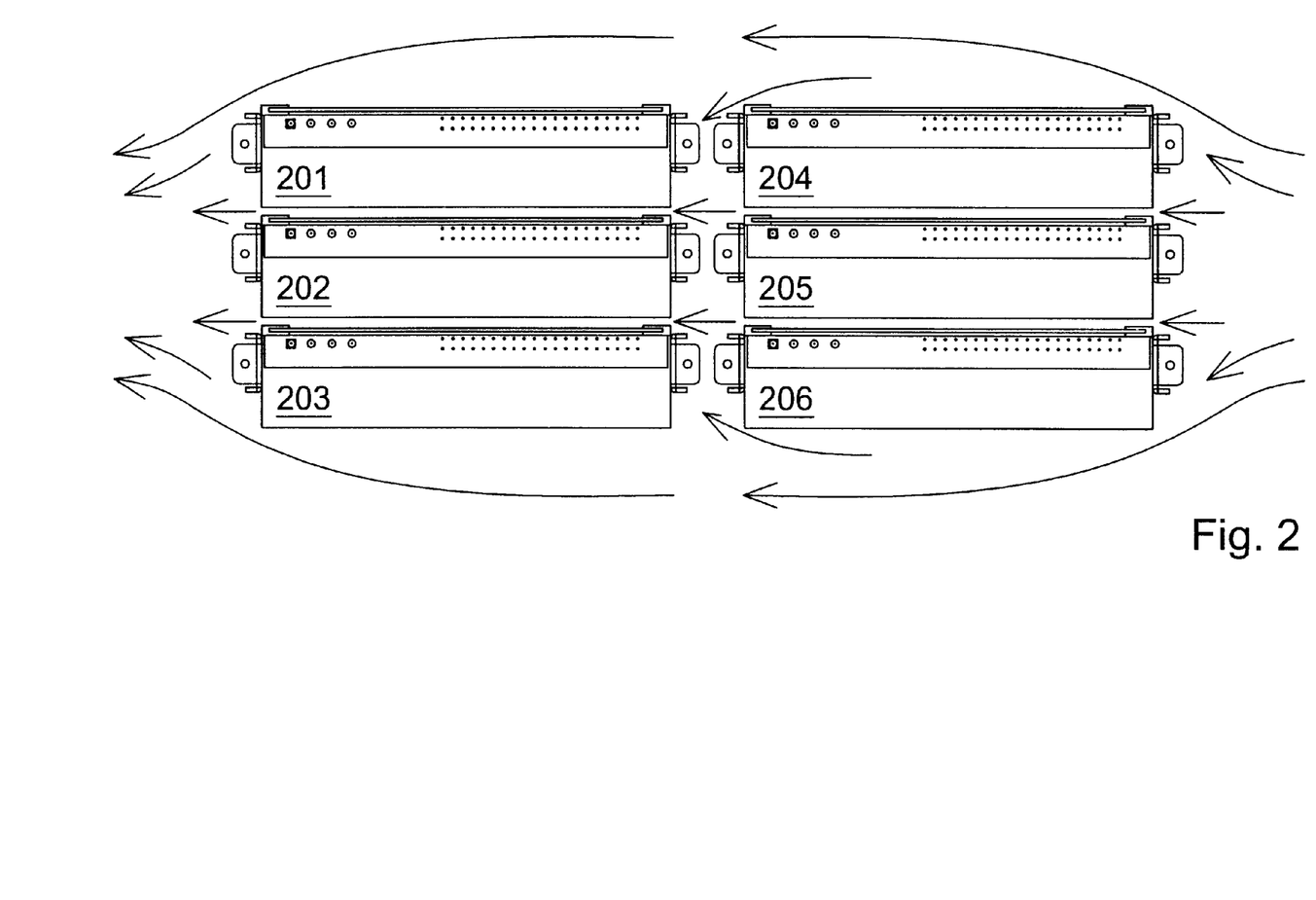
FIG. 2 is a drawing of a typical arrangement of disk drives in an enclosure.

FIG. 2 shows how a conventional high-density arrangement of disk drives may be mounted within an enclosure. In order to better illustrate the interior of the enclosure, the walls of the enclosures and the mounting equipment that connects the disk drives to the enclosure are not shown. Throughout this disclosure, various configurations of disk drives are generally referred to in terms of stacks and layers. These terms refer to the general appearance of the drive configurations, and should not, for example, be read to imply that the drives are literally stacked on top of each other, since the disk drives may actually be mounted within an enclosure and may be mounted at spaced distances from other drives in the same stack or layer. Thus, the terms stack and layer merely refer to a group of disk drives that are arranged in the same plane. For example, in FIG. 2, a stack describes drives arranged in the same vertical plane while a layer describes drives arranged in the same horizontal plane.

In FIG. 2, the stacked layers of disk drives are layered nearly exactly on top of each other, with only a small amount of empty space above, below, and between the disk drives. Thus, in FIG. 2, all of the stacks of disk drives are aligned with the other stacks. Similarly, all of the layers of disk drives are aligned with each other. In other words, each disk drive is directly aligned with the disk drives in the same vertical and horizontal planes as that disk drive. Given the rectangular shape of each disk drive, this aligned arrangement minimizes the amount of space consumed by the disk drives. Minimizing the space consumed by the drives may also enable the size of the enclosure that houses the disk drives to be minimized.

Because the drives in FIG. 2 are packaged so closely together, each drive must contend with both the heat it generates and the heat generated by its neighboring drives. In order to remove heat from the disk drives, one or more cooling devices such as fans or blowers (e.g., centrifugal fans) may be provided (not shown). These cooling devices may be set up so that they move cooler air across the drives, allowing the drives to transfer heat to the cooler air. The air movers then move the heated air away from the area surrounding the disk drives. However, the directly aligned arrangement of the disk drives may reduce the cooling efficiency of such a system.

In FIG. 2, one or more air movers (not shown) are moving air to cool a high-density arrangement of six disk drives 201–206. The airflow created by the air movers follows the path of least resistance. As a result, the airflow is primarily confined to flowing over and around the disk drives. Thus, the airflow between the disk drives is limited. Consequentially, heat transfer away from the some of the drives, especially those in the middle of the arrangement, may also be limited. As the airflow arrows in FIG. 2 show, because all of the drives are aligned, some of the disk drives are blocking airflow to other disk drives. Additionally, the configuration of some of the drives may result in there being very little airflow to cool the logic boards of some drives. For example, if the sides of a drive chassis extend around the logic board of the drive, these "bath tub" sides may be blocking much of the airflow to the partially enclosed logic board. In such situations, both the aligned arrangement and the extended sides of the drive chassis may limit the airflow over the logic board. Similarly, the reduced airflow resulting from the aligned arrangement may lead to less of the surface area of some of the drives, especially the drives in the middle, being cooled.

Figure 3A:
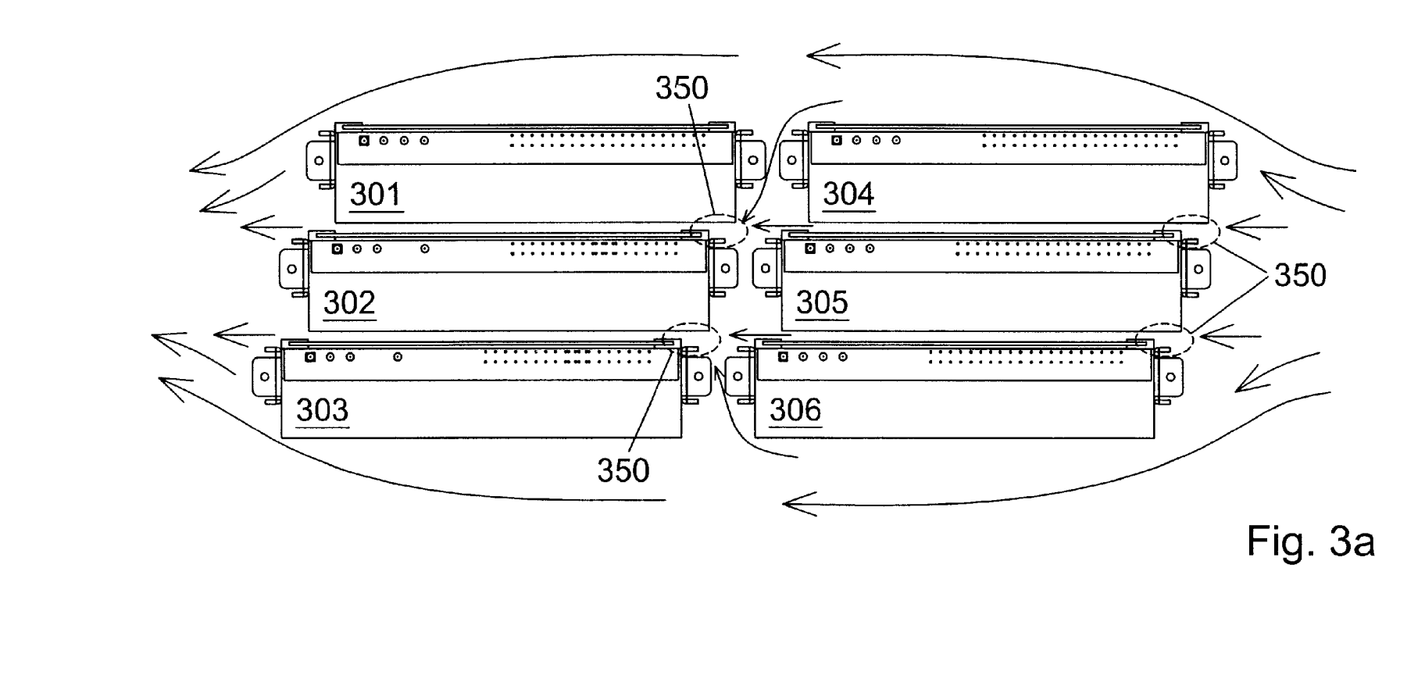
FIG. 3a illustrates one embodiment of an arrangement of disk drives to better maintain airflow between the drives.

As FIG. 2 illustrates, aligned configurations of disk drives tend to reduce airflow to certain drives. In contrast, FIG. 3a shows one embodiment of an arrangement of disk drives that may be mounted within an enclosure and that may allow better airflow to the drives within the enclosure than the traditional arrangement does. Again, the walls of the enclosure and some of the mounting equipment used to couple the disk drives to the enclosure are not shown in order to more clearly illustrate the configuration of drives. In this embodiment, the disk drives are arranged so that the disk drives in each horizontal plane (e.g., layer) are offset from the disk drives in a lower horizontal plane or layer. The offset is in a direction parallel to the horizontal plane that the offset disk drives are in.

In this offset arrangement, portions of the disk drives may now be exposed to more of the airflow than they would be in a traditional, directly aligned arrangement. For example, this configuration may allow better airflow between the disk drives than would be allowed by an aligned configuration. In some embodiments, the offset may create an increased air gap 350 between overlapping disk drives that is larger than a corresponding air gap in an aligned arrangement would be. As the size of the air gap increases, more of the airflow may pass between the drives. In some embodiments, the offset arrangement may cause a larger portion of the airflow to be diverted into a section of the disk drive configuration than would be in a traditional, aligned arrangement. For example, referring to FIG. 3a, as a result of the offset, more of the airflow may be diverted (e.g., by the overhanging portion of drive 305) between drives 305 and 306 than would be if the drives were aligned, and thus there may also be more airflow over the logic board of drive 306. In another example, each drive's surface area may be better cooled by the additional airflow between the drives. For example, if more airflow is diverted between drives (e.g., drives 303 and 302), causing those drives to be exposed to a greater volume of airflow, the greater volume of airflow may remove more heat from the overall surface areas of those drives than would be removed in an aligned arrangement.

Thus, by staggering the layers of disk drives instead of employing a traditional configuration, airflow over the drives may be improved. A similar embodiment of a stacked arrangement of disk drives may stagger or offset the drives longitudinally (i.e., lengthwise) instead of laterally (i.e., widthwise, as shown in FIG. 3a). In another embodiment, the drives may be staggered both longitudinally and laterally. For purposes of this disclosure, a longitudinal or lengthwise offset is one that offsets the drives with respect to the longer sides, while a lateral or widthwise offset is one that offsets the drives with respect to the shorter sides (e.g., the offsets illustrated in FIGS. 3a and 5a).

In general, an increase in airflow may describe many situations. For example, an increase in airflow may refer to a larger volume of air moving across a particular portion of a drive in an offset arrangement than in a traditional arrangement. Generally, an increase in airflow describes any situation in which the volume of air passing over a given portion of a disk drive during a certain time period is increased. Similarly, describing a disk drive or a portion of a disk drive as being exposed to more of an airflow refers to that drive or portion of a drive experiencing an increased airflow. A result of exposing a disk drive (or portion of a disk drive) to an increased airflow may be that the disk drive is able to transfer more heat to the air passing over it, since more air is now passing over that disk drive than was passing over it before the airflow was increased.

In some embodiments, only a portion of the disk drives in a layer may be offset. For example, in one embodiment, only one disk drive in a layer may be offset from an overlapping disk drive in a second layer. The number of disk drives to offset may depend on factors including but not limited to the spacing that would exist between the drives in an aligned arrangement, the number of stacks and/or layers of drives, the heat generation of the drives, the placement of connections between and/or to the disk drives, and the airflow that would exist between the drives in an aligned arrangement.

In some embodiments, the arrangement of disk drives may also maintain a high disk drive density despite the disk drives being staggered laterally and/or longitudinally. For example, the configuration shown in FIG. 3a consumes the same amount of vertical space and only consumes slightly more horizontal space than the traditional system shown in FIG. 2. Thus, airflow between disk drives may be better maintained by staggering the disk drives within an enclosure and, at the same time, such an arrangement may not use a large increase in packaging size. In some embodiments, the increased space consumption may be so slight that the staggered arrangement could fit in the same size enclosure as a corresponding (e.g., one with the same number of disk drives) aligned arrangement. For example, the staggered disk drive arrangement may be used in a standard rack- or cage-mounted system. In other embodiments, however, the staggered or offset configuration may have significantly increased space consumption, and thus may not be able to fit in the same size enclosure as a corresponding aligned arrangement could.

The amount by which the drives are staggered or offset from each other (e.g., the amount by which a disk drive is staggered relative to an overlapping disk drive in a neighboring layer) may vary depending on the space constraints of the disk arrangement and the amount of cooling desired. For example, if constraints on the amount of space dominate the design process, the amount of stagger or offset may be less than in a situation where cooling is the dominant concern. In some embodiments, additional methods of cooling, such as refrigeration systems, Peltier elements, dedicated air movers, heat sinks, etc, may be used so that the amount of offset used to obtain the desired cooling effect may be relatively small. In other embodiments, fewer (or none) of these additional cooling devices may be included, and thus the amount of offset used may be more significant.

Figure 3B:
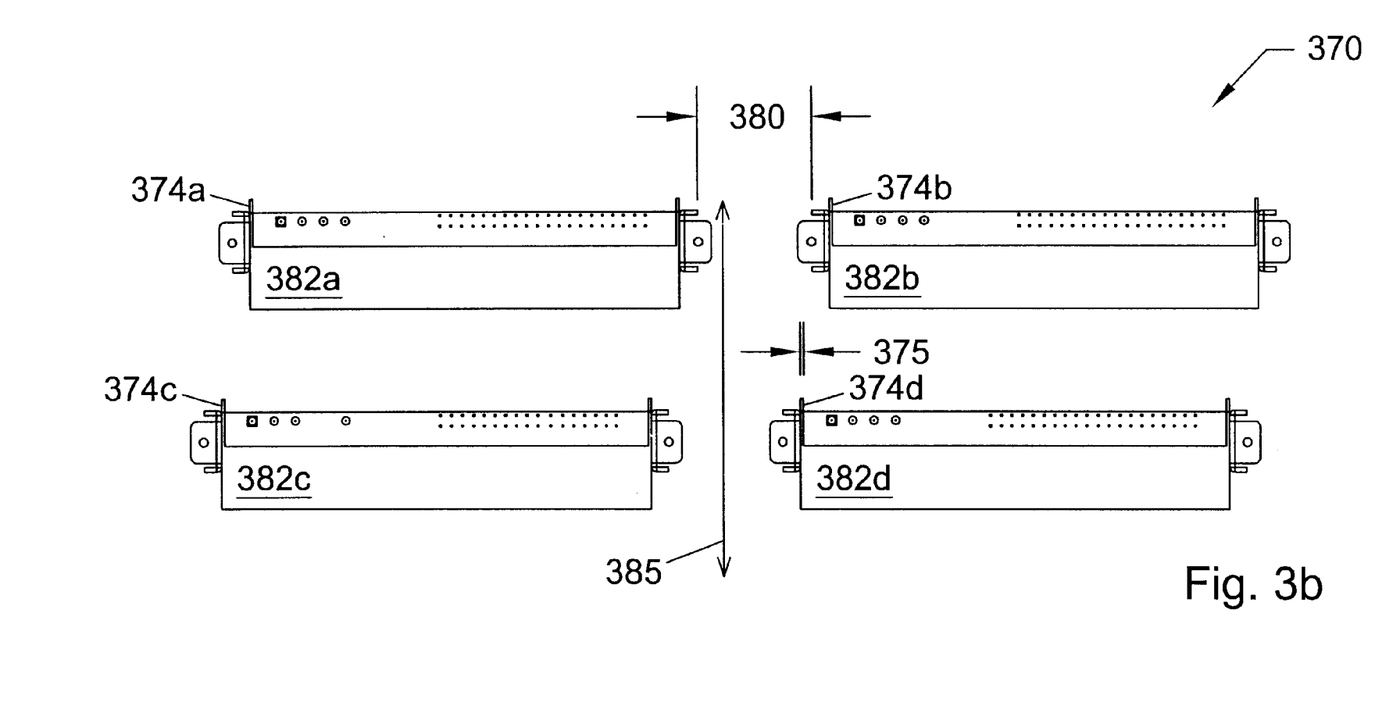
FIG. 3b illustrates various minimum and maximum offsets that may be chosen in some embodiments.

In some embodiments, the sides of the drive chassis may extend over the logic board of the drive, creating a possibly problematic "bath tub" configuration (in other embodiments, like those shown in FIGS. 2–3a, the sides of the drive chassis may not be configured to extend over the logic board in this way). In some of these embodiments, the minimum amount of offset desired may be an amount just greater than the width of the "bath tub" sides of the drive chassis. FIG. 3b illustrates a laterally offset arrangement of disk drives 370. In this illustration, the drives are laterally offset by an amount greater than the width 375 of one of the bath tub-like sides 374 of a drive chassis. Thus, in such an embodiment, the offset may allow increased airflow over the logic boards 382 of the drives by exposing the logic boards to more of the airflow than it would be exposed to if the offset were not greater than the width 375 of one of the bath tub-like sides 374. In other embodiments, the minimum offset may be determined to be an offset that diverts a sufficient amount of airflow needed to provide a desired degree of cooling. The minimum amount of offset may also, in some embodiments, be defined in terms of the size of the air gap that achieves a desired degree of cooling.

In some embodiments, the maximum amount of offset used may be an amount that allows a continuous air channel between stacks of disk drives. For example, in FIG. 3b, a continuous air channel 385 exists between stacks of disk drives despite the layers of disk drives being offset from each other. This continuous air channel exists when none of the disk drives overlap a disk drive in a neighboring stack (e.g., neither of drives 382b and 382d overlap either of drives 382a or 382c). Thus, in embodiments such as those with only two or three layers of disk drives, the maximum offset may be an amount just less than the amount 380 that would cause a disk drive to overlap a disk drive in a neighboring stack. However, some embodiments may not have a continuous air channel.

Additionally, the staggering or offsetting may be done in such a way that the accessibility of the disk drives is minimally or negligibly affected. Thus, in some embodiments, the arrangement of disk drives may employ an offset drive arrangement while still being as physically accessible for connection, repair, hot swapping, and replacement as a traditional arrangement. In other embodiments, an offset drive arrangement may negatively impact the accessibility of all or some of the disk drives. For example, offsetting the drives may, in one embodiment, result in one drive no longer being accessible for connection to a host computer system or storage array using the same connector as would be used in a traditional arrangement. In such an embodiment, additional alterations may be made (e.g., using a longer connector to connect that particular drive). Thus, in some of these embodiments, employing one of the novel configurations described herein may also involve additionally modifying the enclosure in order to achieve a desired level of accessibility.

Figure 4:
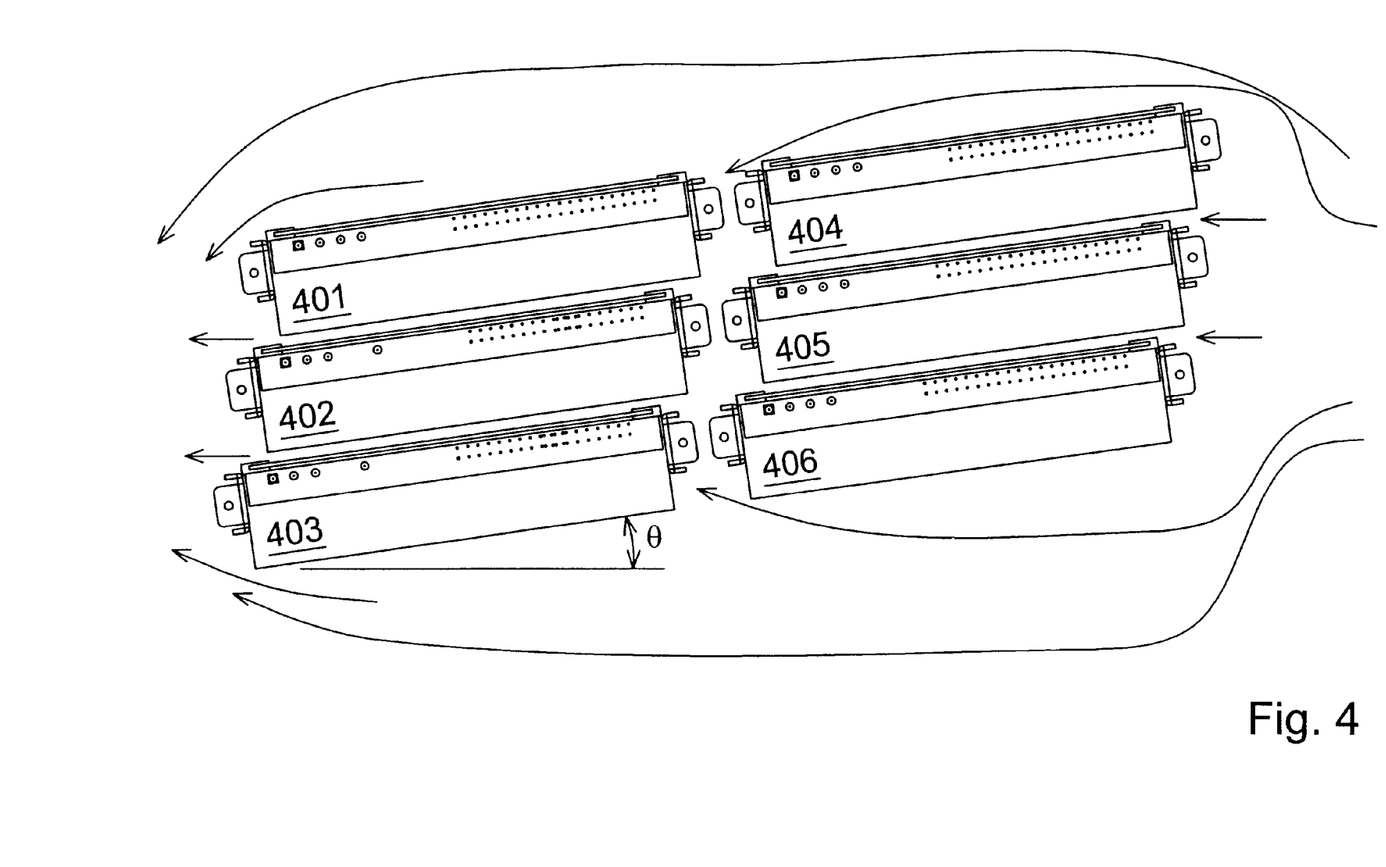
FIG. 4 illustrates another embodiment of an arrangement of disk drives to better maintain airflow between the drives.

FIG. 4 shows another embodiment of a stacked arrangement of disk drives within an enclosure. In this embodiment, the stacked layers are inclined so that they are no longer parallel to the primary direction of airflow within the enclosure. For purposes of this disclosure, the primary direction of airflow is the overall direction of airflow from the perspective of a disk drive or group of disk drives (as opposed to the overall direction of airflow within an enclosure). The primary direction of airflow occurs in response to the operation of the air movers, without taking into account deviations in the airflow that occur due to conditions such as the placement of various objects (e.g., disk drives, connector cables, etc.) within the enclosure. For example, in FIG. 3a, the primary direction of airflow is parallel to the longitudinal axis of the disk drives, and although portions of the airflow are not moving in that exact direction, very little or none of the airflow is moving in a direction opposite to the primary direction of airflow. In some embodiments, inclining the disk drives may result in the disk drives no longer being parallel with the floor and ceiling of the enclosure.

Returning to FIG. 4, portions of the disk drives that would not be exposed to as much the airflow in a non-inclined arrangement may now be exposed to more of the airflow because of the incline. By inclining the stacked layers of disk drives, the disk drives are no longer parallel to the primary direction of airflow. Since the inclined disk drives are at an angle to the primary direction of airflow, more airflow may be diverted between the drives. Additionally, in one embodiment, this configuration may only slightly increase the vertical space requirements of the arrangement. Furthermore, in some embodiments, this configuration may even decrease the horizontal space requirements of the arrangement because as the arrangement of the drives is inclined, it may take up less horizontal space and more vertical space. In some embodiments, the inclined layers may be additionally laterally or longitudinally offset from one another, as is shown in FIG. 4. The staggered disk drive arrangement may be used in a stsandard rack- or cage-mounted system in one embodiment.

The degree of incline (labeled θ in FIG. 4) chosen may vary between embodiments. For example, in one embodiment, the degree of incline may vary depending on the space constraints of the disk arrangement and the amount of cooling desired. For example, if constraints on the amount of space dominate the design process, the degree of inclination may be less than in a situation where cooling is the dominant concern. In some embodiments, additional methods of cooling, such as refrigeration systems, Peltier elements, dedicated air movers, heat sinks, etc, may be used. Since these extra cooling measures provide additional cooling while also increasing the space consumed by the disk drives, the degree of incline used to obtain the desired cooling effect may be relatively small in these embodiments. In other embodiments, fewer (or none) of these additional cooling devices may be included, and thus the degree of incline used may be more significant.

In some embodiments, the minimum degree of incline desired may be the degree of incline that increases the airflow between disk drives enough to provide a desired degree of cooling. In some embodiments, this minimum degree of incline may be chosen to create a minimum air gap that allows the desired degree of cooling. In some embodiments, the maximum degree of incline used may be an amount that allows a continuous air channel between stacks of disk drives from the top to the bottom of the disk drive arrangement. Various other minimum or maximum degrees of incline may be desirable in other embodiments.

Additionally, the inclination of the layers of disk drives may be done in such a way that the accessibility of the disk drives is only minimally or negligibly affected. Thus, the arrangement of disk drives may employ an inclined configuration while still being as accessible for connection, repair, hot swapping, and replacement as a traditional arrangement. In other embodiments, however, employing one of the novel configurations described herein may involve additionally modifying to the enclosure in order to achieve a desired level of accessibility.

Figure 5A:
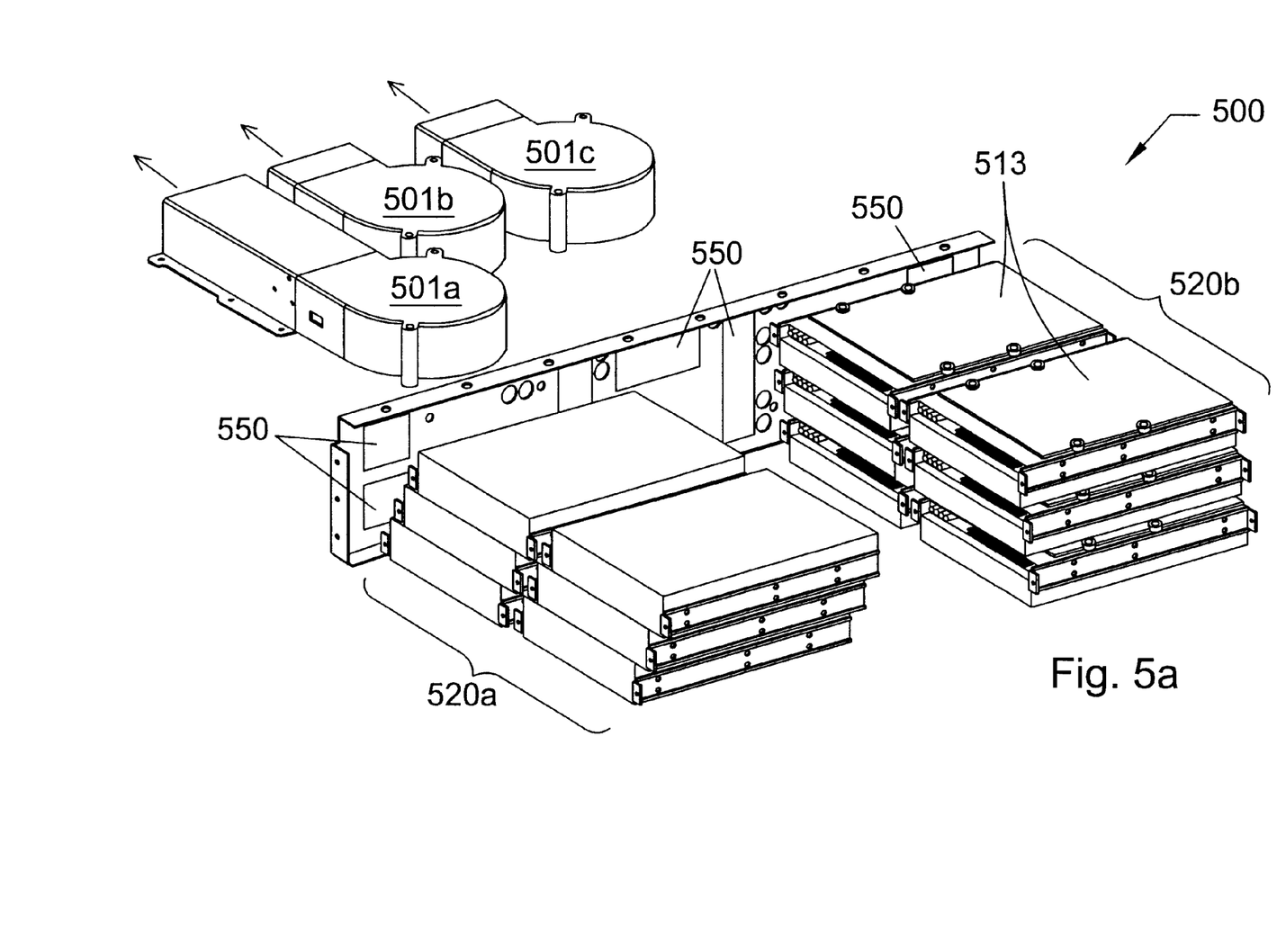
FIG. 5a illustrates one embodiment of a novel arrangement disk drives within an enclosure.
Figure 5B:
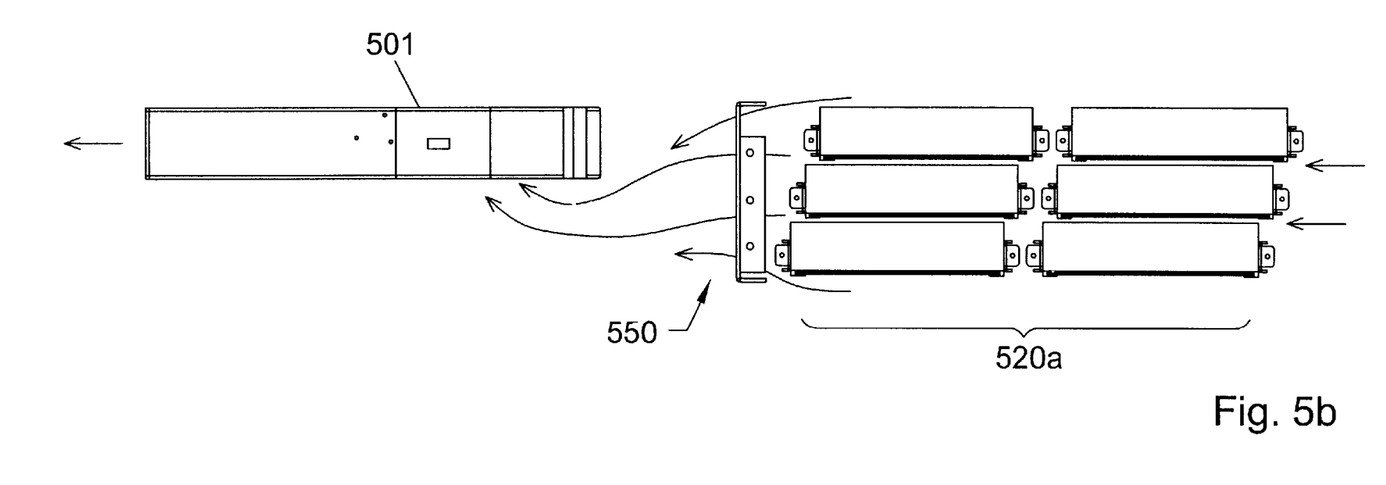
FIG. 5b shows the airflow in the enclosure shown in FIG. 5a according to one embodiment.

FIG. 5a shows an arrangement of disk drives and air movers within an enclosure 500 according to one embodiment. Each disk drive has a logic board 513, but for convenience, only some of these logic boards are shown in the illustration. In this illustration, the sides of the enclosure are not shown so that the inside of the enclosure can be seen more clearly. In this example, the layers of disk drives are staggered laterally. Several air movers 501 may be configured to cool the disk drives 520. The air movers 501 are, in this embodiment, configured to draw air across the disk drives, through the holes 550, and into the intakes of air movers 501. The air movers then blow this air out of the enclosure. FIG. 5b shows a side view of the disk drives 520a and air movers 501 from FIG. 5a. In this illustration, some of the airflow over, around, and between the disk drives 520 is indicated by airflow arrows.

Figure 6:
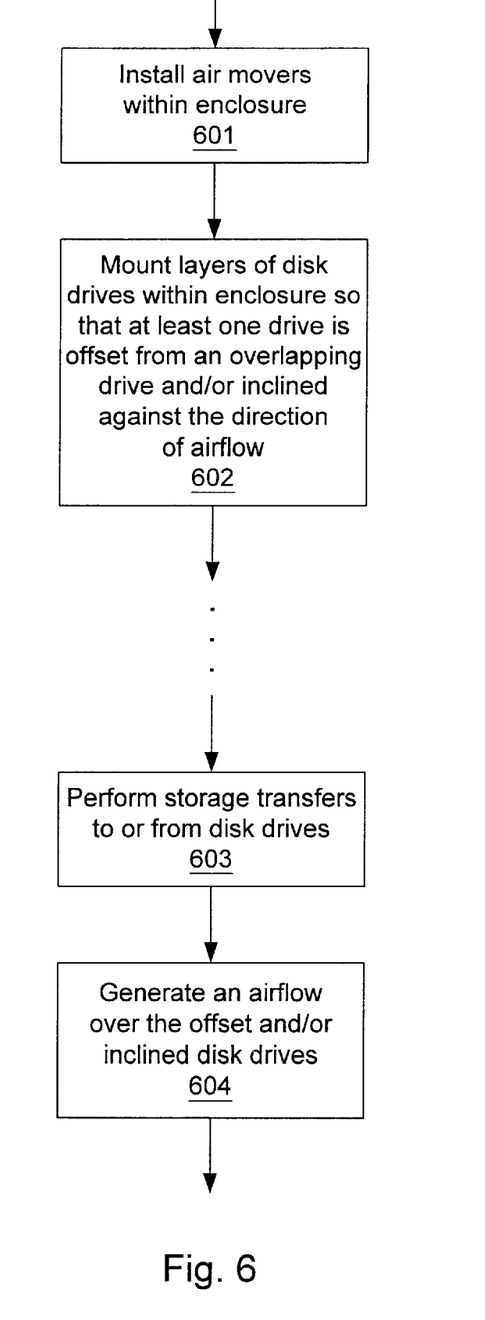
FIG. 6 illustrates a method of arranging and cooling disk drives in an enclosure to better maintain airflow to the disk drives according to one embodiment.

FIG. 6 illustrates a method of cooling a high-density arrangement of disk drives according to one embodiment. One or more air movers are installed within an enclosure, as indicated at 601. Also, a plurality of layers of disk drives is mounted within the enclosure at 602. Note that no temporal order is implied by the flowchart of FIG. 6. For example, in some embodiments, the disk drives may actually be mounted before the fans, or vice versa. The disk drives are mounted within the enclosure so that at least one disk drive in one layer is offset from an overlapping disk drive in another layer. As a result of this mounting configuration, at least one of the plurality of disk drives receives more of the airflow from the air movers than it would otherwise receive.

The offset may be a longitudinal offset, a lateral offset, an offset resulting from the layer the disk drive is in being inclined in relation to the airflow, or various combinations of all three. The offset(s) chosen may depend on factors such as a preferred location and/or configuration for one or more air movers in the enclosure. For example, depending on the direction of the airflow within the enclosure or the orientation of disk drives within the enclosure, it may be more desirable to choose either a lateral or a longitudinal offset, or both. Furthermore, the amount of the offset may depend on various factors, including but not limited to: the desired size of the enclosure, the cooling requirements of the drives, and the desired accessibility of the drives. Additionally, one or more of the layers of disk drives may be inclined against the airflow so that the layer is not parallel to the airflow.

FIG. 6 also shows a method for cooling a high-density arrangement of disk drives according to one embodiment. Storage transfers are performed to and from multiple disk drives, causing them to generate heat at 603. In 604, airflow is generated to cool the disk drives. Note that no temporal order is suggested by the placement of blocks 603 and 604, because in some embodiments, the airflow may be generated before the storage transfers are performed. The disk drives may be arranged within the enclosure so that at least one of the disk drives in a first layer is offset from an overlapping disk drive in a second layer and/or inclined in relation to the direction of airflow within the enclosure. In some embodiments, all of the disk drives in the first layer may be offset from corresponding overlapping disk drives in the second layer. Because of the arrangement of the disk drives, at least one of the disk drives receives more of the airflow than would be received if the disk drives were configured in an aligned arrangement. The offset chosen may be a lateral offset, a longitudinal offset, or both. The amount of offset chosen (e.g., the amount by which each layer of disk drives is staggered relative to a neighboring layer) may depend on various factors such as the desired size of the enclosure, the cooling requirements of the drives, the desired accessibility of the drives, and the total amount of airflow.

In one embodiment, the term disk drive may refer to any semi-permanent or permanent storage place for digital data, as opposed to a temporary workspace for executing instructions and processing data (e.g. a random access memory (RAM)). A disk drive may be any peripheral storage device that holds, spins, reads and writes magnetic or optical disks or any other suitable mass storage media. A disk drive may be a receptacle for disk cartridges, disk packs or floppy disks, or it may contain non-removable disk platters like most personal computer hard disks. In some embodiments, disk drive may be limited to disk-type storage media.

Furthermore, it is noted that a high-density arrangement of disk drives refers to any arrangement of multiple disk drives in an enclosure. For example, in some embodiments, a high-density arrangement of disk drives may simply refer to a JBOD arrangement, whereas in another embodiment, the same description may refer to a RAID arrangement.

A disk drive may be configured to communicate with other devices using various interfaces. In some embodiments, a disk drive may have an ATA (AT Attachment), or IDE (Integrated Drive Electronics), interface, or some variant thereof, such as EIDE or Ultra ATA. In other embodiments, a disk drive may have a Small Computer System Interface (SCSI) or some variant thereof such as SCSI-2, Ultra SCSI Ultra2 SCSI, or Ultra160 SCSI. In another embodiment, a disk drive may have a Fibre Channel interface.

Numerous variations and modifications will become apparent to those skilled in the art once the above disclosure is fully appreciated. It is intended that the following claims be interpreted to embrace all such variations and modifications.

What is claimed is:

1. A storage system, comprising:
 a plurality of stacked layers of disk drives, wherein each layer comprises a plurality of disk drives, wherein the plurality of disk drives are configured to operate as a computer or network storage system; and
 one or more air movers, wherein a portion of the air movers are configured to cool the plurality of stacked layers of disk drives by creating an airflow;
 wherein at least one disk drive in a first layer is offset from an overlapping disk drive in a second layer, wherein the offset is in a direction parallel to a plane that includes the first layer.

2. The storage system of claim 1, wherein every disk drive in the first layer is offset from a corresponding overlapping disk drive in the second layer.

3. The storage system of claim 1, wherein an air gap created by the at least one disk drive being offset from the overlapping disk drive is configured to divert a portion of the airflow so that the at least part of the one of the disk drives in the plurality of stacked layers is exposed to more of the airflow than the at least part of the one of the disk drives would be exposed to if the at least one disk drive in the first layer was aligned with the overlapping disk drive in the second layer.

4. The storage system of claim 3, wherein the air gap is further configured to divert a portion of the airflow so that a logic board of the one of the disk drives in the plurality of stacked layers is exposed to more of the airflow than the logic board would be exposed to if the at least one disk drive in the first layer was aligned with the overlapping disk drive in the second layer.

5. The storage system of claim 3, wherein the air gap is further configured to divert a portion of the airflow so that a surface area of the one of the disk drives in the plurality of stacked layers is exposed to more of the airflow than the surface area would be exposed to if the at least one disk drive in the first layer was aligned with the overlapping disk drive in the second layer.

6. A storage system, comprising:
 a plurality of stacked layers of disk drives, wherein each layer comprises one or more disk drives, wherein the plurality of disk drives are configured to operate as a computer or network storage system; and
 one or more air movers, wherein a portion of the air movers are configured to cool the plurality of stacked layers of disk drives by creating an airflow;
 wherein at least one disk drive in a first layer is offset from an overlapping disk drive in a second layer, wherein the offset is in a direction parallel to a plane that includes the first layer;
 wherein an offset of the at least one disk drive in the first layer relative to the overlapping disk drive in the second layer comprises a widthwise offset.

7. The storage system of claim 6, wherein an offset of the at least one disk drive in the first layer relative to the overlapping disk drive in the second layer comprises a lengthwise offset.

8. The storage system of claim 1, wherein the storage system has a same size as the storage system would have if the at least one disk drive in the first layer was not offset from the overlapping disk drive in the second layer.

9. The storage system of claim 1, wherein an amount of the offset is greater than a width of a side of a drive chassis of one of the disk drives in the plurality of stacked layers.

10. The storage system of claim 1, wherein a continuous air channel separates a first stack from a second stack of the disk drives in the plurality of stacked layers.

11. The disk drive storage system of claim 1, wherein the disk drives in the plurality of stacked layers have a substantially same physical accessibility for connection, repair, hot swapping, or replacement as the disk drives would have if the at least one disk drive in the first layer was not offset from the overlapping disk drive in the second layer.

12. The disk drive storage system of claim 1, wherein at least one of the layers is inclined so that the at least one inclined layer is not parallel to a primary direction of the airflow.

13. The disk drive storage system of claim 1, wherein the disk drive storage system is configured to be rack-mounted.

14. A storage system, comprising:
 a plurality of stacked layers of disk drives, wherein each layer comprises a plurality of disk drives, wherein the plurality of disk drives are configured to operate as a computer or network storage system; and
 one or more air movers, wherein a portion of the air movers are configured to cool the plurality of stacked layers of disk drives by creating an airflow, wherein the airflow has a primary direction;
 wherein at least one of the stacked layers are inclined so that the at least one stacked layer is not parallel to the primary direction of the airflow.

15. The storage system of claim 14, wherein all of the stacked layers are inclined so that none of the stacked layers are parallel to the primary direction of the airflow.

16. The storage system of claim 14, wherein a degree of inclination of the at least one stacked layer is such that a logic board of the one of the disk drives in the plurality of stacked layers is exposed to more of the airflow than the logic board would be exposed to if the at least one stacked layer was not inclined.

17. The storage system of claim 14, wherein a degree of inclination of the at least one stacked layer is such that a surface area of the one of the disk drives in the plurality of stacked layers is exposed to more of the airflow than the surface area would be exposed to if the at least one stacked layer was not inclined.

18. The storage system of claim 14, wherein the storage system has a same size as the storage system would have if the at least one stacked layer was not inclined.

19. The storage system of claim 14, wherein the disk drives in the plurality of stacked layers have a substantially same physical accessibility for connection, repair, hot swapping, or replacement as the disk drives would have if the at least one disk drive in the at least one stacked layer was not inclined.

20. The disk drive storage system of claim 14, wherein at least one disk drive in a first layer is offset from an overlapping disk drive in a second layer.

21. The disk drive storage system of claim 14, wherein the disk drive storage system is configured to be rack-mounted.

22. A method of arranging a computer or network storage system within an enclosure, comprising:
 installing one or more air movers within the enclosure so that, when operating, a first portion of one or more air movers cools the disk drives by generating an airflow, wherein the airflow has a primary direction; and
 mounting the disk drives within the enclosure, wherein the mounted disk drives are arranged in a plurality of layers, wherein each of the layers comprises a plurality of disk drives, and wherein said mounting comprises at least one of:

mounting the disk drives so that at least one disk drive in a first layer of the disk drives is offset from an overlapping disk drive in a second layer of the disk drives, wherein the offset is in a direction parallel to a plane that includes the first layer, or mounting the disk drives so that at least one disk drive is not parallel to the primary direction of the airflow;

wherein said mounting results in at least a part of one of the disk drives being exposed to more of the airflow generated by the first portion of the air movers than the at least part of the one disk drive would be exposed to if the at least one disk drive in the first layer was not offset from the overlapping disk drive in the second layer or if the at least one disk drive was parallel to the primary direction of the airflow.

23. The method of claim 22, wherein every disk drive in the first layer is offset from a corresponding overlapping disk drive in the second layer.

24. The method of claim 22, wherein an air gap created by the at least one disk drive being offset from the overlapping disk drive is configured to divert a portion of the airflow so that the at least part of the one of the disk drives is exposed to more of the airflow than the at least part of the one of the disk drives would be exposed to if the at least one disk drive in the first layer was aligned with the overlapping disk drive in the second layer.

25. The method of claim 24, wherein the air gap is further configured to divert a portion of the airflow so that a logic board of the one of the disk drives is exposed to more of the airflow than the logic board would be exposed to if the at least one disk drive in the first layer was aligned with the overlapping disk drive in the second layer.

26. The method of claim 24, wherein the air gap is further configured to divert a portion of the airflow so that a surface area of the one of the disk drives is exposed to more of the airflow than the surface area would be exposed to if the at least one disk drive in the first layer was aligned with the overlapping disk drive in the second layer.

27. A method of arranging a computer or network storage system within an enclosure, comprising:

installing one or more air movers within the enclosure so that, when operating, a first portion of the air movers cools the disk drives by generating an airflow, wherein the airflow has a primary direction; and mounting the disk drives within the enclosure, wherein the mounted disk drives are arranged in a plurality of layers, wherein each of the layers comprises one or more disk drives, and wherein said mounting comprises at least one of:

mounting the disk drives so that at least one disk drive in a first layer of the disk drives is offset from an overlapping disk drive in a second layer of the disk drives, wherein the offset is in a direction parallel to a plane that includes the first layer, or mounting the disk drives so that at least one disk drive is not parallel to the primary direction of the airflow;

wherein said mounting results in at least a part of one of the disk drives being exposed to more of the airflow generated by the first portion of the air movers than the at least part of the one disk drive would be exposed to if the at least one disk drive in the first layer was not offset from the overlapping disk drive in the second layer or if the at least one disk drive was parallel to the primary direction of the airflow;

wherein an offset of the at least one disk drive in the first layer relative to the overlapping disk drive in the second layer comprises a lateral offset.

28. The method of claim 22, wherein an offset of the at least one disk drive in the first layer relative to the overlapping disk drive in the second layer comprises a longitudinal offset.

29. The method of claim 22, wherein an amount of the offset is greater than a width of a side of a drive chassis of one of the disk drives.

30. The method of claim 22, wherein a continuous air channel separates a first stack from a second stack of the disk drives.

31. A method of cooling a plurality of disk drives within an enclosure comprising:

performing storage transfers to or from the plurality of disk drives, wherein one or more of the disk drives generates heat; and generating an airflow over offset or inclined regions of the disk drives within the enclosure to cool the disk drives, wherein the disk drives are arranged in a plurality of layers, each of the layers comprising a plurality of disk drives, so that one or more layers of the disk drives are offset from each other or so that one or more layers of the disk drives are inclined against a primary direction of the airflow, wherein if the one or more layers of the disk drives are offset from each other, the offset is in a direction parallel to a plane that includes one of the layers, and wherein the disk drives are further arranged so that at least part of one of the disk drives is exposed to more of the airflow than the at least part of the one of the disk drives would be exposed to if the layers were not so arranged.

32. A storage system, comprising:

an enclosure;

a plurality of stacked layers of disk drives, wherein each layer comprises a plurality of disk drives mounted within the enclosure, wherein the plurality of disk drives are configured to operate as a computer or network storage system; and one or more air movers, wherein a portion of the air movers are configured to cool the plurality of stacked layers of disk drives by creating an airflow within the enclosure;

wherein at least one of the stacked layers are inclined so that the at least one stacked layer is not parallel to a floor of the enclosure.

33. The storage system of claim 32, wherein all of the stacked layers are inclined so that none of the stacked layers are parallel to the floor of the enclosure.

34. The storage system of claim 32, wherein a degree of inclination of the at least one stacked layer is such that a logic board of the one of the disk drives in the plurality of stacked layers is exposed to more of the airflow than the logic board would be exposed to if the at least one stacked layer was not inclined.

35. The storage system of claim 32, wherein a degree of inclination of the at least one stacked layer is such that a surface area of the one of the disk drives in the plurality of stacked layers is exposed to more of the airflow than the surface area would be exposed to if the at least one stacked layer was not inclined.

36. The storage system of claim 32, wherein the storage system has a same size as the storage system would have if the at least one stacked layer was not inclined.

37. The storage system of claim 32, wherein the disk drives in the plurality of stacked layers have a substantially same physical accessibility for connection, repair, hot swapping, or replacement as the disk drives would have if the at least one disk drive in the at least one stacked layer was not inclined.

38. The disk drive storage system of claim 32, wherein at least one disk drive in a first layer is offset from an overlapping disk drive in a second layer.

39. The disk drive storage system of claim 32, wherein the enclosure is configured to be mounted in a rack or a cage.

\* \* \* \* \*